United States Patent [19]

Standford et al.

[11] Patent Number: 4,859,960
[45] Date of Patent: Aug. 22, 1989

[54] DIGITAL SIGNAL DEMODULATION

[75] Inventors: Richard T. A. Standford, Bracknell; Roger Biggs, Leatherhead, both of England

[73] Assignee: British Aerospace Public Limited Company, London, England

[21] Appl. No.: 212,246
[22] Filed: Jun. 27, 1988
[51] Int. Cl.$^4$ .............................................. H03D 3/00
[52] U.S. Cl. ...................................... 329/126; 329/50
[58] Field of Search ................ 329/50, 107, 109, 110, 329/126, 135; 375/80, 82

[56] References Cited

U.S. PATENT DOCUMENTS 4,567,442  1/1986  Haussmann ......................... 329/145

FOREIGN PATENT DOCUMENTS

0046213  2/1982  European Pat. Off. .
2144288  2/1985  United Kingdom .

Primary Examiner—David Mis
Attorney, Agent, or Firm—Cushman, Darby & Cushman

[57] ABSTRACT

A method of demodulating a high frequency carrier signal having at least one parameter modulated by a low frequency modulating signal comprises translating the signal to a low intermediate frequency, digitizing the translated intermediate frequency signal at a correspondingly low sampling rate and applying terms from the resulting digital time series to a non-linear processor to produce an output representative of the instantaneous value of the modulated parameter. Deriving an instantaneous value of the modulated parameter removes the need to use a high intermediate frequency for the carrier and enables the signal to be sampled at a low sampling rate.

9 Claims, 9 Drawing Sheets

FLOW DIAGRAM OF SIMULATION PROGRAM

DIGITAL SIGNAL DEMODULATION

BACKGROUND OF THE INVENTION

In conventional analogue modulation techniques a signal is used to modulate one or more of the parameters of a carrier wave i.e. phase, amplitude or frequency. The carrier wave is usually of a frequency significantly greater than that of the modulating signal. As a result the modulated parameter may be assumed to be constant over several cycles of the carrier wave. Conventional demodulation techniques, such as zero-crossing counting in the case of frequency modulation, make use of this to obtain accuracy by averaging over several carrier signal cycles.

In applying digital signal processing techniques to demodulation the methods used to date have in general been functionally equivalent to the standard analogue techniques. Examples of such techniques are described in GB-A-2144288; EP-A-0046213; and, US-A-4567442. Typically the carrier is translated to an intermediate frequency by means of a superheterodyne process but this intermediate frequency still has to be high enough for the assumption that the modulated parameter is constant to hold for most demodulation techniques. In the case of frequency modulation, for example, digital zero-crossing techniques have been used in which the frequency at which the numerical representation of the signal falls below a threshold value is assessed over several cycles. Such techniques require a sampling rate high enough to produce an accurate digital representation of the modulated intermediate frequency signal since lower sampling rates result in unacceptable levels of distortion caused by aliasing. Therefore even though digitisation is carried out after translation of the carrier to the intermediate frequency it is still necessary to use a high sampling rate at least as great as the Nyquist rate characteristic of the intermediate frequency. The need to sample at a high rate and to transmit and process the resulting large bandwidth digital signal, a substantial part of which is redundant since all the information is contained within the narrower bandwidth characteristic of the modulating signal, is in many applications a significant disadvantage.

STATEMENT OF THE INVENTION

According to the present invention a method of demodulating a signal comprising a high frequency carrier signal having at least one parameter modulated by a low frequency modulating signal comprises translating the signal to a low intermediate frequency, digitising the translated intermediate frequency signal at a correspondingly low sampling rate and applying terms from the resulting digital time series to a non-linear processor to produce an output representative of the instantaneous value of the modulated parameter.

By deriving an instantaneous value of the modulated parameter rather than deriving a value over several cycles of the carrier a method in accordance with the present invention removes the need to use a high intermediate frequency for the carrier. With conventional demodulation techniques the intermediate frequency $f_i$ has had to satisfy the relationship $f_i >> f_m$ where $f_m$ is the highest frequency of the modulating signal. Thus a typical FM receiver operating in the broadcast band of 88 to 108 MHz uses a high intermediate frequency of 10.7 MHz. If the modulating signal has a maximum frequency $f_m$ of 15 KHz the ratio of $f_I$ to $f_m$ is greater than 500:1. Digitising the signal would therefore require the use of a sampling rate at least as great as the Nyquist rate characteristic of the signal at the high intermediate frequency of 10.7 MHz. The present invention by contrast enables the use of a low intermediate frequency such that the ratio of $f_I$ to $f_m$ is significantly smaller than with known techniques: typically $f_I$ may be of the same order of magnitude as $f_m$. The ability to use a correspondingly low sampling rate offers significant advantages in terms of cost and performance of components such as A/D converters. A low ratio between the intermediate frequency and the modulating frequency also confers important functional advantages in the many applications where it is necessary to minimise the redundant bandwidth of the digitised signal as, for example, when multiplexing a number of such signals for transmission over a channel of restricted bandwidth.

The non-linear processor may perform a Fast Fourier Transform to produce an output representative of the instantaneous value of the modulated parameter but preferably uses sinusoidal curve-fitting.

Preferably at least three successive terms of the digital time series are applied to the non-linear processor to produce the output representative of the instantaneous value of the modulated parameter. Preferably a method in accordance with the present invention further comprises taking one further term from the digital time series and applying the one further term and all but the first of the at least three successive terms to the non-linear processor to produce a further output representative of the next instantaneous value of the modulated parameter, and so on.

By substituting the at least three consecutive values of the digital time series in the equation of a sinusoidally varying signal it is possible to solve for any of the three parameters, phase, frequency or amplitude. This method of demodulation is therefore equally applicable to frequency modulation, phase modulation and amplitude modulation. This contrasts with the known methods of demodulation which are dedicated to the detection of a single form of modulation. Equally the initial translation to a low intermediate frequency and sampling processes are applicable to phase, amplitude or frequency modulated signals. Moreover it is not necessary to remove any modulation of the other parameters before a given parameter is demodulated. This again contrasts with conventional demodulation methods: known methods of frequency demodulation, for example, require that the signal is limited to remove any significant amplitude modulation before it is applied to a frequency discriminator. These advantages make demodulation in accordance with the present invention particularly advantageous when applied to the demodulation of intercepted communications since it is not possible to predict in advance the nature of the modulation used in such signals.

BRIEF DESCRIPTION OF THE DRAWINGS

A method of demodulation in accordance with the present invention is now described in detail with reference to the accompanying drawings, in which.

DESCRIPTION OF A PREFERRED EXAMPLE

Figure 1:
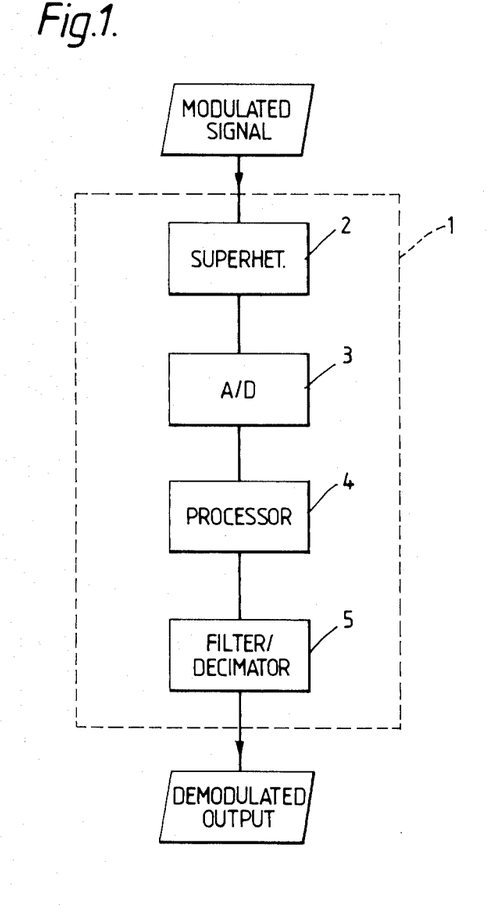
FIG. 1 is a flow diagram of a method in accordance with the present invention.
Figure 2:
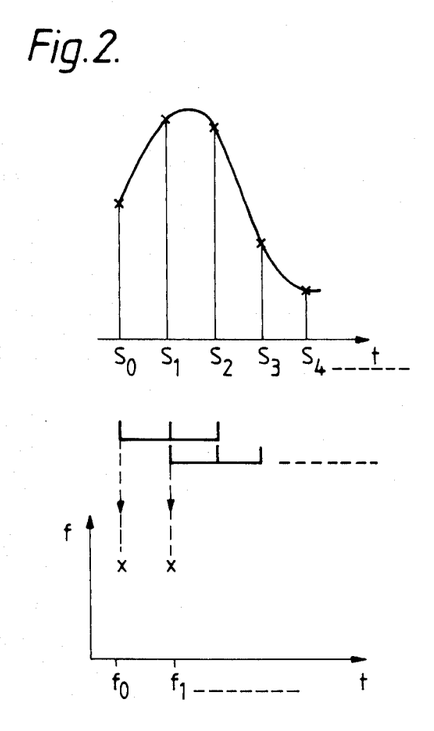
FIG. 2 is a diagram illustrating the sampling processes used in a method in accordance with the present invention.

A radio frequency analogue signal comprising a high frequency carrier wave frequency modulated by a low frequency signal, is applied to the input of a demodulator 1. A superheterodyne circuit 2 translates the carrier wave to a low intermediate frequency $f_I$ such that $1.2 < f_I/f_m$ where $f_m$ is the maximum frequency of the modulating signal: in practice a typical value is $f_I/f_m = 10$. The translated signal is then applied to an A/D converter 3 which, (as shown in FIG. 2) samples the signal at a low sampling rate greater than the Nyquist rate characteristic of the low intermediate frequency $f_I$ and outputs a digital time series in which each term represents an instantaneous amplitude of the translated signal. Groups of three successive terms from the digital time series are applied to a non-linear processor 4 which, in a manner described in detail below, calculates from the three terms instantaneous values of each of the three parameters, one or more of which may convey the modulation. The calculated values may then be output in numerical form for further processing or may be used directly to reconstitute the original signal.

In order to optimise the output signal to noise ratio the values of the modulated parameter or parameters are low pass filtered with a filter bandwidth equal to that of the original modulating signal (if this is known). If a reduction in data rate is required the filter system 5 used for this purpose may include a decimator. The A/D converter 3, the filter and decimator 5 and non-linear processor 4 may conveniently be formed as part of a single suitably programmed microprocessor which for applications requiring a high processing speed has a parallel processing bit slice architecture.

To determine the instantaneous value of the modulated parameter, e.g. frequency in the case of an FM signal, a process of sinusoidal curve fitting is used. It is assumed that any 3 consecutive points of the digital time series, representing the FM signal, can be associated with a function of the form:

$$S_i = A * \cos(W*T*i + Phi) \quad (1)$$

where

A is the amplitude, assumed constant over any 3 samples
W is the instantaneous radian frequency
T is the sample interval
i is an integer
Phi is an arbitrary phase offset For any 3 samples, of unit sample rate, one can state, $S_o = A * \cos(Phi)$
$S_1 = A * \cos(W + Phi)$
$S_2 = A * \cos(2W + Phi)$ and $$(S_o + S_2) / (2*S_1) = \cos(W)$$

thus $$f = (1/(2*pi)) * acs((S_o + S_2)/(2*S_1)) \quad 0 < f < 0.5$$

or $$f = -(2/(pi)) * asn((S_o + S_2)/(2*S)) \quad -1 < f < 1 \quad (2)$$

where
f is the instantaneous frequency
acs and asn are the arc cosine and arc sine functions respectively. The next value for f is calculated from terms $S_1$, $S_2$, $S_3$ and a general term $f_K$ is given by $$f_K = -(2/pi) * asn((S_K + S_{K+2})/2S_{K+1})$$

where $S_K$, $S_{K+1}$, $S_{K+2}$ are successive general terms of the digital time series. Values for $f_K$ are calculated at a rate equal to the sampling rate of the digital time series. Similarly expressions for general values of the amplitude, $A_{K1}$ and phase, $phi_K$, in terms of sample values $S_K$ may be derived. Making the following substitutions, $$X_K = S_{K+1}^2 - S_K S_{K+2}$$

$$Y_K = \frac{S_K + S_{K+2}}{2K_{K+1}}$$

the expressions for the three parameters become, $$f_K = (-2/Pi) asn(Y_K)$$

$$A_K = \left( \frac{X_K}{1 - Y_K^2} \right)^{\frac{1}{2}} \quad (3)$$

$$|Phi_K| = \left| acs\left( \frac{S_K}{A_K} \right) \right| \quad (4)$$

with the sign of Phi given by the sign of $$(S_K Y_K - S_{K+1})$$

Since the expression for frequency involves a division by the sample $S_1$, it is necessary to include default expressions to accommodate the possibility of $S_1 = 0$. Two default expressions for instantaneous frequency have been considered for the case $S_1 = 0$. These are:

$$f_i = f_{i-1}$$

and $$f_i = f_{i-1} + (f_{i-1} - f_{i-2})$$

where
$f_i$ refers to the frequency at time i.

In addition, the above expressions may be applied whenever the absolute value of $S_1$ is below some threshold value. In the absence of companding digital samples which are small in magnitude compared to the peak value will be least accurate due to quantisation error. It may therefore be preferable to use one of the default expressions for frequency instead of eqn. (2), when the sample magnitude is below a fixed threshold.

Figure 3:
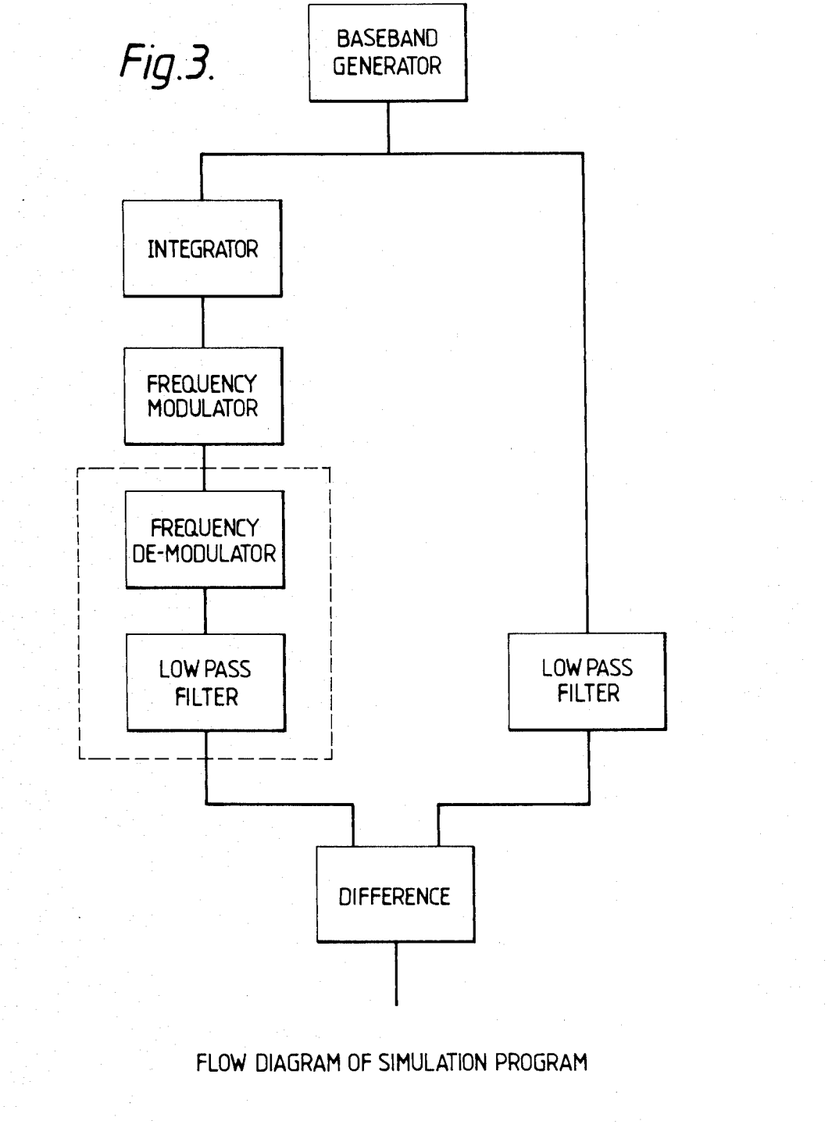
FIG. 3 is a flow diagram of a program used to evaluate, the performance, of a method in accordance with the present invention.

In order to evaluate the performance of a method in accordance with the present invention a microcomputer was programmed to generate a frequency modulated signal together with appropriate forms of noise and then to demodulate the signal using the method of the present invention. A flow diagram of the relevant processes is shown in FIG. 3. Current capabilities allow both sinusoidal and bandlimited noise functions for the baseband signal form. In the case of noise, frequency emphasis was applied (6 dB/octave) prior to bandlimiting to a maximum modulation frequency equal to 0.02 of the sampling frequency.

An integration process was then applied, followed by multiplication by the 'deviation frequency'. This function was then used to modulate the argument of a sinusoid with a carrier frequency component, generally equal to 0.25 of the sampling frequency.

Having been synthesised the FM signal was demodulated using the 3 point discriminator algorithm, (eqn.(2)), after which the frequency estimates were filtered to maximise the signal to noise ratio (SNR). To obtain a noise figure for the discriminator algorithm itself, the original baseband signal was also filtered by an identical low pass filter. This was then used to compare with the demodulated signal, and by taking the difference between them the 'process noise' generated by the discrimination algorithm was extracted. The SNR was generally estimated over 256 sample points which corresponds to approximately 50 cycles of the highest modulation frequency.

The performance of the algorithm was investigated as a function of SNR at the RF/IF stage and also in relation to parameters instrinsic to the algorithm itself, such as threshold and linear extrapolation.

Figure 4:
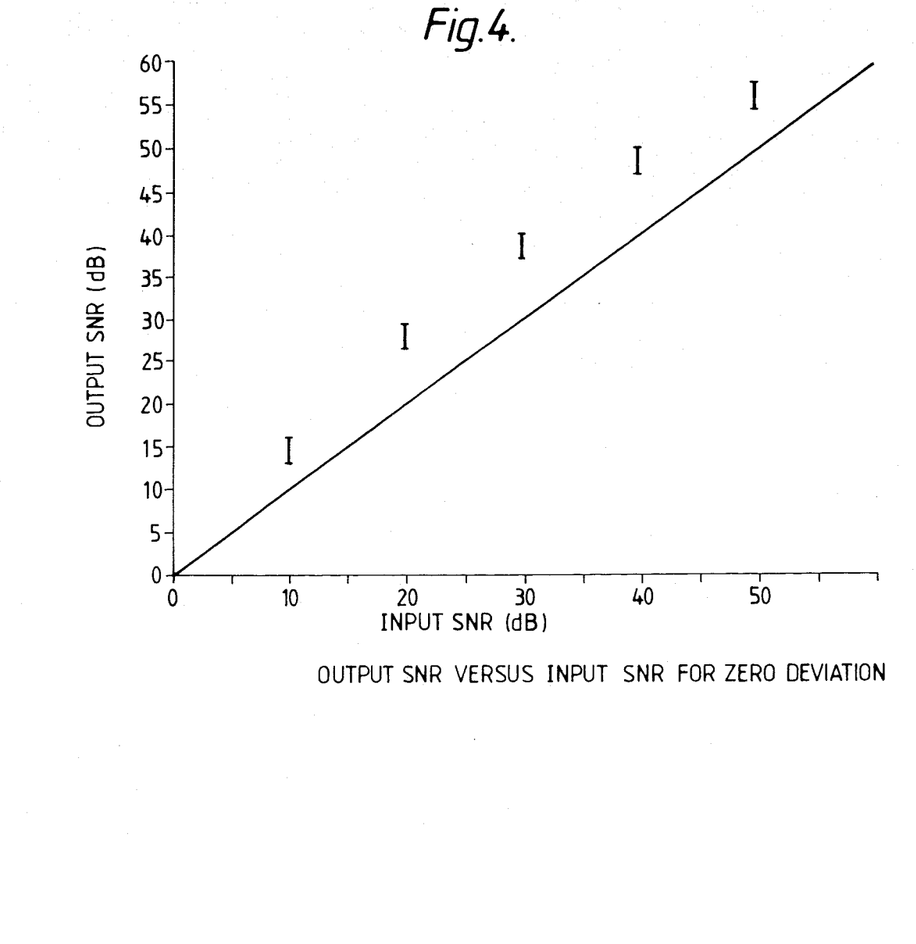
FIGS. 4 to 9 are graphs showing the results of an evaluation of the performance of a method in accordance with the present invention.
Figure 5:
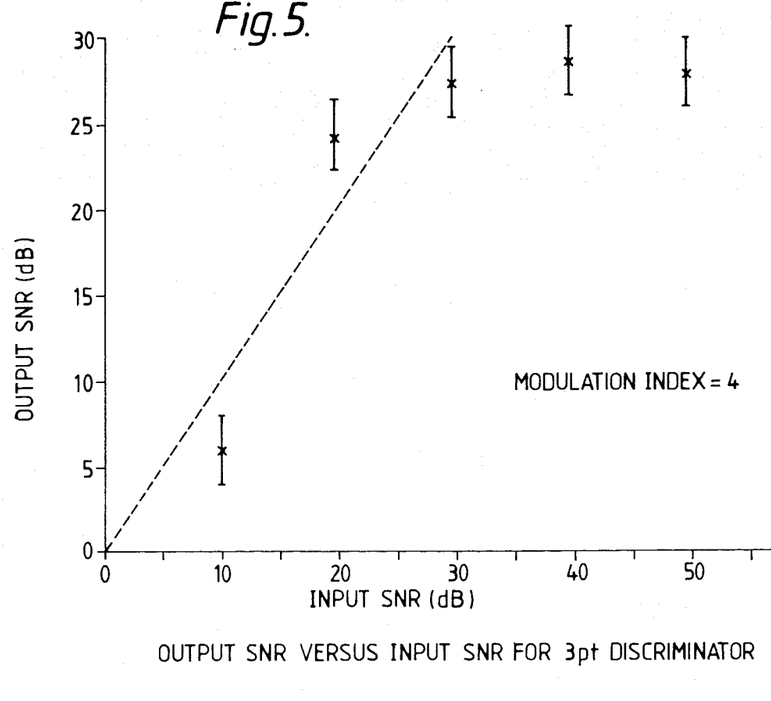

FIG. 4 shows the measured output SNR versus the input SNR for a simple fixed carrier frequency (i.e. zero deviation). Since the model assumes the samples are derived from a sinusoidal function, the output SNR can be in excess of 60 dB when the input SNR is sufficiently high. FIG. 5 shows the performance of the discriminator for finite frequency deviation (=0.08 of sample frequency). The noise power here refers to the noise as measured over the full Nyquist bandwidth and the signal power for the FM signal is given by $A*A/2$, where A is the amplitude. It can be seen that the output SNR reaches a maximum value of approximately 30 dB when the input SNR is better than 40 dB. The output SNR then falls rapidly below 10 dB input SNR, showing a 'threshold' effect at approximately 15 dB input SNR. Between 10 and 20 dB input SNR the system appears to yield some gain which will be dependent upon the modulation index of the FM signal. The absolute values of the output SNR are characteristic of the particular ratio of $f_i/f_m$ employed. Where a higher SNR is required this may be obtained by using a higher ratio of $f_i/f_m$ and a correspondingly higher degree of post demodulation filtering.

The 3 point discriminator algorithm is essentially a continuous sine curve fitting exercise which involves taking 3 successive samples of the FM signal and solving for frequency at each stage. A minimum of 3 points is needed in view of the fact that amplitude, frequency and phase are all unknown values in the expression for a sinusoid. It is therefore apparent that only when the signal is an accurately represented, time invariant sinusoid that the algorithm will yield wholly accurate frequency estimates. In the evaluation the effects of finite quantisation error were included by modelling the digitised signal with 8 bit resolution. With this constraint, it will be appreciated that when the amplitude of the 3 samples is small, relative to the maximum amplitude, (e.g.. at or near zero crossings), the frequency estimates, given by the algorithm, will be least accurate, tending to infinite values which can only be limited to permissable maximum deviation.

Figure 6:
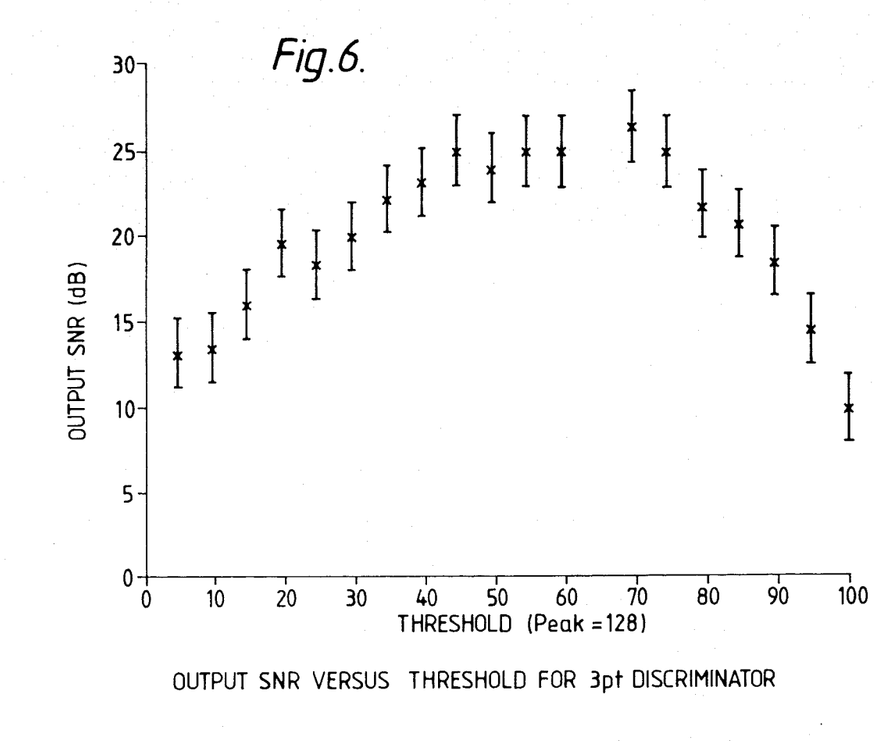

In an attempt to optimise the algorithm in the presence of quantisation error, a threshold test is placed upon the central sample. Provided the value of the sample is greater than the threshold the expression for frequency is evaluated. If it is less, one of a number of option is possible. The simplest option is to select the previous estimate of frequency as the new estimate. FIG. 6 shows the output SNR as a function of the threshold. A value for the threshold of 64, (in a maximum of 127) was found to be optimal and with sign-/magnitude representation of the sample offered the further advantage that only the most significant bit of the magnitude word needed to be tested to determine the appropriate procedure for evaluating the frequency estimate.

Figure 7:
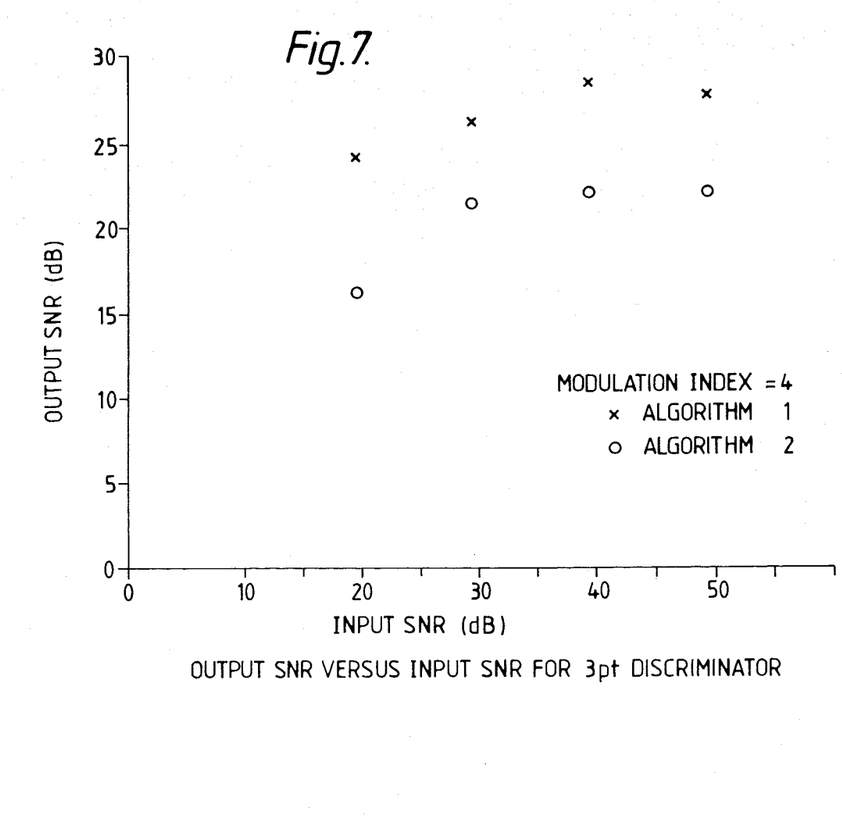

Two versions of the algorithm were examined to test the performance when the central sample was less than the threshold. These were:
 1) Set frequency equal to previous estimate
 2) Set frequency equal to previous estimate + previous gradient FIG. 7 shows the effect on the output SNR of the two algorithms. Normally one would expect algorithm 2) to be superior. However, since the frequency estimates are subject to process noise, linear extrapolation can give rise to very large errors and simulation has shown that setting the new estimate equal to the previous estimate is a better option. In addition, linear extrapolation would require further tests to be applied to the demodulated signal to prevent the frequency estimates from exceeding reasonable limits.

Figure 8:
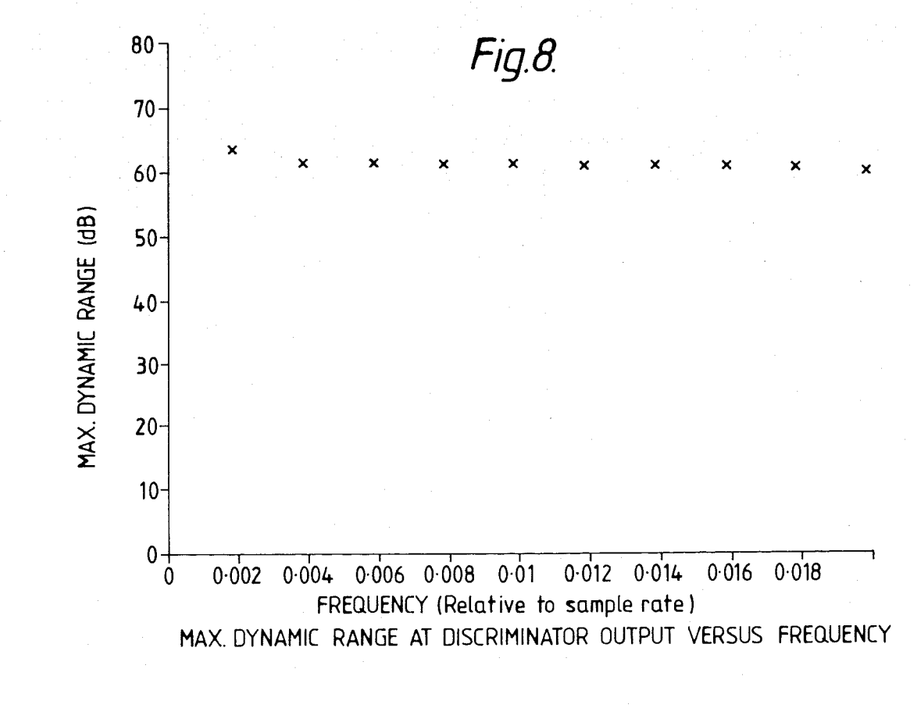

In order to estimate the dynamic range of the output of the discriminator, sinusoidal functions were applied to the input with 'infinite' SNR. Under such circumstances, the only source of noise was the quantisation noise for 8 bit representation. The noise component of the discriminator output was then extracted by subtracting the actual frequency from the estimated frequencies (over a period corresponding to 256 sample points). A value for the rms error in amplitude could then be deduced, and since the maximum amplitude at the discriminator output was unity, the dynamic range could be expressed in dB's as $-20*LOG(\text{rms error})$. Rms errors were deduced for a range of phase offsets in the sampled time series and the minimum value selected to represent the maximum dynamic range for the discriminator process. FIG. 8 shows the results for a range of frequencies offset relative to half Nyquist. To accommodate a dynamic range of approximately 60 dB the output of the discriminator should have a 'word size' of 12 bits.

Figure 9:
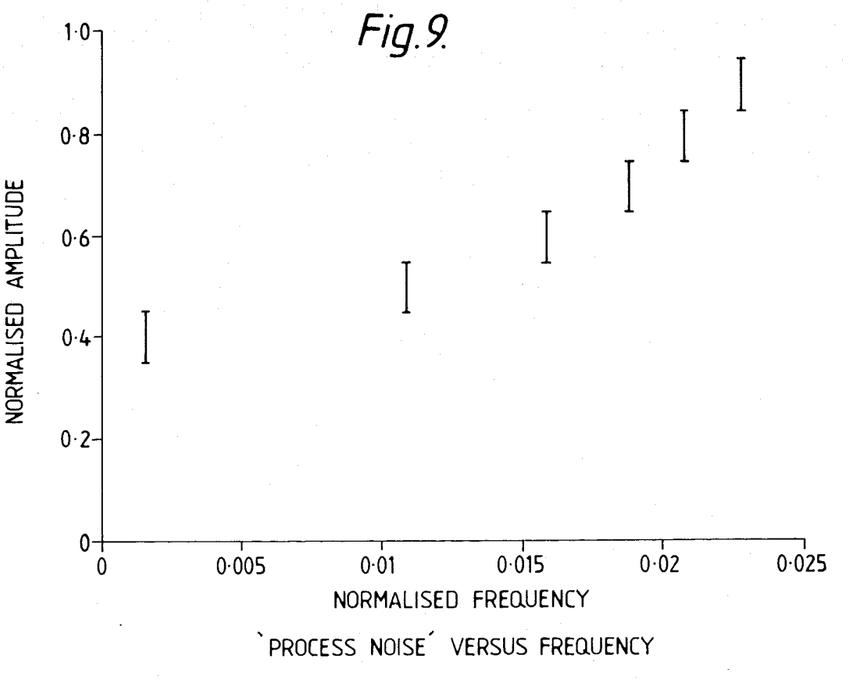

With regard to the demodulation of frequency multiplexed signals it is usually desirable to ensure equal SNR in all channels of the multiplexed group. To determine the behaviour of a method in accordance with the present invention in respect of this requirement the "process noise" was monitored as a function of frequency. Since the modulating Gaussian noise signal is linearly frequency weighted the process noise should exhibit the same linear frequency dependence in order to maintain the same SNR in all the frequency multiplexed channels which constituted the modulating signal. FIG. 9 indicates a levelling-off of the process noise towards low frequencies: as a result channels placed at the lower end of a multiplexed group would be expected to suffer from a greater proportion of process noise. However it is found that the form of the process noise spectrum is dependent upon the choice of threshold level so that in applications where this trend in the process noise would otherwise present significant problems the performance of the modulator may be optimised by choosing a suitable value for the threshold level to balance the requirements of the total SNR level and the uniformity of distribution of the noise.

We claim:

1. In a method of demodulating a modulated high frequency carrier signal, wherein a parameter of said modulated high frequency carrier signal is modulated by a low frequency modulating signal, said method comprising the steps of:

initially translating said high frequency carrier signal to a low intermediate frequency which is such that a ratio between said low intermediate frequency and said frequency of said modulating signal is less than 500:1, sampling said intermediate frequency signal at a low sampling rate corresponding to said low intermediate frequency and thereby producing terms of a digital time series to thereby digitize said signal, applying said terms to non-linear processor means, and using said non-linear processor means to produce an output representative of an instantaneous value of said modulated parameter.

2. The method of claim 1, wherein said using said non-linear processor means step includes the step of producing said output representatives of said instantaneous value of said modulated parameter by sinusoidal curve-fitting.

3. The method of claim 1, wherein said using said non-linear processor means step includes the step of applying at least three successive terms of said digital time series to said non-linear processor means to produce an output representative of said instantaneous value of said modulated parameter.

4. The method of claim 3, further comprising the step of taking one further term from said digital time series and applying said one further term and all but a first one of said at least three successive terms to said non-linear processor means to produce a further output representatives of a next instantaneous value of said modulated parameter.

5. The method of claim 1, wherein said using said non-linear processor means step includes the step of producing said output representative of said instantaneous value of said modulated parameter by performing a Fast Fourier Transform.

6. A demodulating device, comprising:

means for receiving a signal to be demodulated which includes a high frequency carrier signal modulated with a low frequency information signal; and demodulating means for demodulating said signal, including means for:

(a) translating said high frequency carrier signal to a low intermediate frequency such that a ratio of said low intermediate frequency to said low frequency of said modulating information signal is less than 500:1, (b) converting said low intermediate frequency signal to a digital signal by sampling said low intermediate frequency signal at a low sampling rate which is lower than a Nyquist rate for said high frequency carrier signal, and (c) calculating values indicative of a demodulated information signal from said A/D converted intermediate frequency signal.

7. A device as in claim 6 wherein said calculating means includes a means for fitting three successive terms of said digital intermediate frequency signal to a sinusoidal curve.

8. A device as claim 6 wherein said demodulating means is formed by a digital computer.

9. A device as claimed 7 wherein said demodulating means is formed by a digital computer.

* * * * *